United States Patent [19]

Raush

[11] Patent Number: 4,591,169

[45] Date of Patent: May 27, 1986

[54] SEAL ARRANGEMENT FOR RETAINING A LIQUID LEVEL ABOVE A STRIP PASSING THROUGH A CHAMBER

[75] Inventor: Russell G. Raush, Conestoga, Pa.

[73] Assignee: RCA Corporation, Princeton, N.J.

[21] Appl. No.: 746,310

[22] Filed: Jun. 19, 1985

[51] Int. Cl.[4] .......................... F16J 15/40; F16J 15/48
[52] U.S. Cl. ............... 277/135; 277/DIG. 7; 68/5 E; 34/242
[58] Field of Search ............ 277/207 R, DIG. 7, 135, 277/68; 34/242; 118/733; 68/5 E

[56] References Cited

U.S. PATENT DOCUMENTS

| 2,212,588 | 8/1940 | Csanyi | 277/DIG. 7 |
| 2,553,938 | 5/1951 | Peirce | 277/DIG. 7 X |
| 3,061,943 | 11/1962 | Bennett et al. | 34/242 X |
| 3,082,774 | 3/1963 | Benton et al. | 134/63 |
| 3,698,700 | 10/1972 | Ziehm, Jr. et al. | 266/6 S |
| 3,927,540 | 12/1975 | Tanaka et al. | 68/5 E |
| 3,979,030 | 9/1976 | Boman | 277/135 X |
| 4,326,556 | 4/1982 | Deutsch et al. | 277/135 X |

FOREIGN PATENT DOCUMENTS

| 47-30970 | 8/1972 | Japan | 277/DIG. 7 |
| 1242468 | 8/1971 | United Kingdom | 277/DIG. 7 |
| 640073 | 12/1978 | U.S.S.R. | 277/DIG. 7 |

Primary Examiner—Robert S. Ward
Attorney, Agent, or Firm—E. M. Whitacre; D. H. Irlbeck; L. L. Hallacher

[57] ABSTRACT

A seal arrangement for retaining liquid in a chamber at a level above some of the sides of the chamber includes two pairs of rollers. The rollers of each pair contact one another at a height above the low sides of the chamber. The rollers in each pair are arranged at different levels so that the rollers contact one another at a point higher than the height of the low sides of the chamber. Flexible seal members extend from the bottom of the chamber to a point above the center of each of the bottom rollers. Pressure of liquid in the chamber biases the flexible seal members against the rollers to prevent liquid from leaking along the bottom of the rollers. Restrictions in the outlets of the chamber establish the liquid level at a height which is above the contact point of the pairs of rollers so that both sides of a strip of material passing between the pairs of rollers are washed with the liquid.

8 Claims, 2 Drawing Figures

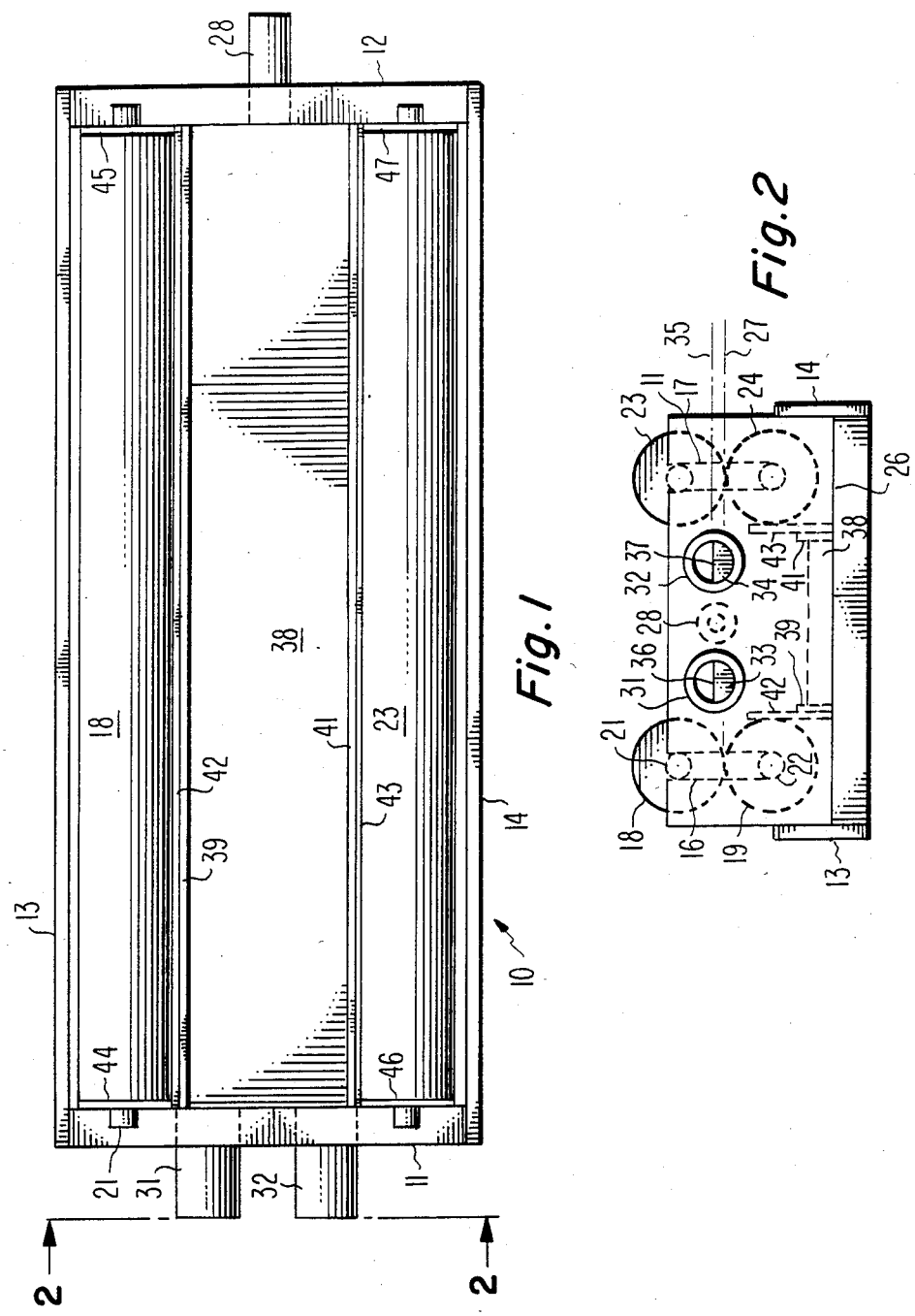

SEAL ARRANGEMENT FOR RETAINING A LIQUID LEVEL ABOVE A STRIP PASSING THROUGH A CHAMBER

BACKGROUND

This invention relates generally to seals and particularly to a seal arrangement for sealing liquid in a chamber at a level above the height of a strip passing through the chamber.

Many thin metal items, such as shadow masks for color picture tubes, are made by acid etching. In acid etching, a pattern of the part to be etched is photographically produced on a photoresist material which is coated onto the metal. The photoresist material is exposed to light through a transparent material bearing the opaque pattern. The unexposed portion of the photoresist material is washed away leaving bare metal along the pattern, while the exposed material protects the metal from the acid. Typically, a large number of the patterns are photographically produced on a long strip of metal which is horizontally pulled through an acid etch tank. The acid in the tank etches through the bare metal to produce the desired part. Frequently, the pattern is produced on both sides of the metal strip and the etching occurs from both sides.

The metal strip moves continuously through the etch tank. After etching is completed and the strip exits from the tank, a large amount of acid clings to the photoresist material on both sides of the strip. It is essential that this acid be removed as soon as possible. Typically, the acid is removed by spraying the strip with a rinsing solution in a spray chamber. However, when the etched pattern contains a large number of small apertures, rinsing solution does not fully enter the apertures. Because of the importance of complete cessation of acid etching immediately after the strip leaves the etch tank, it is preferrable to have a rinsing chamber in which the strip is completely submersed in liquid located in the closest possible proximity of the etch tank exit. This has been difficult in the past because the liquid in the rinsing chamber must pass over both sides of the strip and therefore the liquid level in the chamber must be higher than the strip. The strip, therefore, must pass either over or through the sides of the chamber making it very difficult to seal the rinsing liquid in the chamber. For these reasons, there is a need for a seal arrangement for retaining liquid in a chamber at a level higher than the height of the strip being rinsed. The liquid level must, therefore, also be higher than some of the sides of the chamber, whereby a horizontal strip of material can be pulled through the liquid with the liquid flowing over both sides of the strip. The present invention fulfills this long felt need.

SUMMARY

A seal arrangement for retaining liquid in a chamber at a level above a strip passing through the chamber and at a level higher than some of the sides of the chamber has two sides higher than the desired level of liquid, and two sides lower than the desired level of liquid. Two pairs of rollers are supported by the high sides. The rollers in each pair are in contact at a height higher than the low sides so that a sheet of material can pass between the rollers above the low sides. Each pair of rollers has an upper roller and a lower roller with the lower roller spaced at a predetermined distance above the bottom of the chamber. The rollers have a length substantially equal to the length of the low sides. First and second seal members are fixed to the bottom of the chamber and have a height exceeding the predetermined distance and a length substantially equal to the length of the rollers. Each of the seal members engages one of the lower rollers of the first and second pairs. Liquid is supplied between the seal members whereby liquid pressure biases the seal members against the lower rollers and the liquid is confined between the pairs of rollers.

BRIEF DESCRIPTION OF THE DRAWINGS

FIG. 1 is a top view of a preferred embodiment.
FIG. 2 is a side view along line 2—2 of FIG. 1.

DETAILED DESCRIPTION

In FIGS. 1 and 2, a chamber 10 has two substantially parallel high sides 11 and 12 and two substantially parallel low sides 13 and 14. In FIG. 2, the high side 11 contains two substantially vertical parallel slots 16 and 17 which are cut partially through the side. A similar pair of slots is arranged in the other high side 12. A first pair of rollers 18 and 19 respectively have shafts 21 and 22 rotatably supported in the slot 16. A second pair of rollers 23 and 24 is similarly supported in the slot 17. The bottom rollers 19 and 24 are supported a preselected distance above the bottom 26 of the chamber 10. Also, the rollers 18 and 19 of the first pair contact one another at a level which is higher than the height of the low sides 13 and 14. The rollers 23 and 24 in the second pair can contact one another at essentially the same height that the rollers 18 and 19 contact one another, this height is indicated by the line 27. A strip of material to be etched, not shown, is pulled horizontally through the chamber 10 between the rollers in each pair at the height of the line 27.

A liquid inlet 28 is arranged in the side 12 and is used to supply liquid to the chamber 10. The center of the inlet 28 is arranged at the same height as the line 27. Because of the height of the inlet, a liquid current is established on both sides of the strip to enhance the rinsing affect of the liquid.

Liquid outlets 31 and 32 are coupled into the high sidewall 11 and allow liquid to flow from the chamber 10. The outlets 31 and 32 can be coupled to a waste liquid retention container, not shown. Restrictions 33 and 34 are arranged in the outlets 31 and 32, respectively. The restrictions 33 and 34 are in the form of discs having a portion removed to form flat edges 36 and 37. The flat edges 36 and 37 are arranged at a height, indicated by a line 35, above the height of the line 27 where the rollers 18, 19 and 23, 24 contact. The restrictions 33 and 34 thus determine the level at which liquid is retained in the chamber 10. This level is set above the height where the rollers in each pair touch and therefore a strip of thin material being drawn through the chamber 10 between the roller pairs has liquid on both sides to wash away any residue acid from the strip. The liquid level can be changed simply by changing the size of the portion removed from the restrictions 33 and 34. The liquid level also can be set by placing a low area in the top of the side 11 and eliminating the outlets 31 and 32.

A bottom support 38 is arranged between the rollers 19 and 24 and extends the full length of the chamber 10. Flexible members 39 and 41 are fixed to the sides of the bottom support 38 and also extend the full length of the chamber 10. The members 39 and 41 are made of a flexible material, such as PVC, and are also sealed to the bottom 26 of the chamber 10. A seal member 42 is affixed to the bottom 26 and the flexible member 39 and extends upwardly to contact the roller 19 at a point above the center of the roller. A similar seal member 43 is affixed to the flexible member 41 and the bottom 26, and contacts the roller 24. The seals 42 and 43 are made of a flexible acid resistant material, such as neoprene. If desired, members made of acid inert material, such as mylar, can be arranged between the seals and the rollers to reduce friction. Additional seals 44 to 47 are arranged between the ends of the rollers 18 and 23 and the sidewalls 11 and 12 to prevent liquid from leaking around the ends of the rollers. These seals can be in the form of teflon washers which are fixed to the ends of the rollers. Accordingly, liquid supplied to the chamber 10 is confined by the seals 42 to 47 and by the rollers 18, 19, 23 and 24 whereby the liquid level is maintained above the height of the low sides 13 and 14 and above the height of the line 27 at which the material passes through the chamber 10.

In operation, liquid is supplied to the chamber 10 through the inlet 28. The liquid fills the chamber and the liquid pressure biases the seals 42 and 43 against the rollers 19 and 24 respectively. The portion of the chamber 10 between the pairs of rollers thus fills to a level established by the flat edges 36 and 37 of the restrictions 33 and 34 in the outlets 31 and 32, respectively. A strip of material, leaving an etch tank, not shown, is pulled between the rollers 18, 19 and also between the rollers 23, 24 and both sides of the strip pass through the liquid because the liquid level is above the point where the rollers contact. The area of the inlet 28 is made equal to, or less than, the total area of the outlets 31 and 32 to assure equal inflow and outflow rates so that the liquid level within the chamber 10 remains constant as liquid continuously passes through the chamber. The level of liquid in the chamber 10 and the strip being pulled between the roller pairs are above the height of the low sides 13 and 14 and therefore, the chamber 10 can be arranged immediately adjacent to the outlet of the etch tank without liquid leakage between the etch tank and the chamber. Also, liquid is prevented from leaking into any rinse tank which is adjacent to the output end of the chamber 10. The rinsing action of the liquid can be enhanced by the use of ultrasonic transducers to vibrate the liquid. Such transducers would be submerged in the liquid beneath the line 27 where the strip is pulled through the chamber. Vibrations will pass through the strip and vibrate the liquid on both sides of the strip.

What is claimed is:

1. A seal arrangement for retaining liquid in a chamber at a level higher than a portion of the sides of said chamber, said chamber including two substantially parallel high sides having a height greater than the desired level of said liquid, and two substantially parallel low sides having a height less than the desired level of said liquid, said high and low sides being attached to a bottom section, said seal arrangement comprising:

a first and a second pair of rollers supported by said high sides, the rollers in each pair being in contact at a height higher than the height of said low sides whereby a sheet of material can pass between said rollers above said low sides, each pair of rollers having an upper roller and a lower roller, said lower roller being spaced a predetermined distance above the bottom of said chamber, said first and second pairs of rollers being horizontally spaced along said high sides with said rollers being substantially parallel to said low sides, said rollers having a length substantially equal to the length of said low sides;

first and second seal members fixed to the bottom section of said chamber, said seal members having a height exceeding said predetermined distance and a length substantially equal to the length of said rollers, said first and second seal members engaging said lower rollers of said first and second pairs respectively; and means for supplying liquid between said seal members whereby liquid pressure biases said seal members against said lower rollers and said liquid is confined between said pairs of rollers.

2. The seal arrangement of claim 1 further including liquid outlet means whereby liquid can continuously flow through said chamber, and also including means within said outlet means for establishing the liquid level within said chamber.

3. The seal arrangement of claim 2 wherein said means within said outlet is a portion of a disc whereby said liquid level can be adjusted by changing said portion.

4. The seal arrangement of claim 3 wherein said means for providing liquid, said liquid outlet means, and said means within said outlet are dimensioned to permit liquid flow into and out of said chamber at substantially the same rate.

5. The seal arrangement of claim 4 further including seal means arranged between the ends of said rollers and said high sides.

6. The seal arrangement of claim 5 wherein the rollers in each of said a pairs are vertically stacked.

7. The seal arrangement of claim 3 further including seal means arranged between the ends of said rollers and said high sides.

8. The seal arrangement of claim 1 wherein said first and second seal members engage said lower rollers in the proximity of the center of said rollers.

* * * * *